United States Patent
Hallivuori (10) Patent No.: US 7,978,023 B2
(45) Date of Patent: Jul. 12, 2011

(54) APPARATUS AND METHOD FOR WIRELESS COMMUNICATIONS

(75) Inventor: Juha Samuel Hallivuori, Tampere (FI)

(73) Assignee: Nokia Corporation, Espoo (FI)

( * ) Notice: Subject to any disclaimer, the term of this patent is extended or adjusted under 35 U.S.C. 154(b) by 196 days.

(21) Appl. No.: 12/381,483

(22) Filed: Mar. 11, 2009

(65) Prior Publication Data

US 2010/0231319 A1 Sep. 16, 2010

(51) Int. Cl.
*H03H 7/38* (2006.01)

(52) U.S. Cl. .......................................................... 333/32

(58) Field of Classification Search ................ 333/32, 333/33, 34, 35
See application file for complete search history.

(56) References Cited

U.S. PATENT DOCUMENTS 5,406,236 A * 4/1995 Newell et al. ................. 333/206

FOREIGN PATENT DOCUMENTS

WO WO-2007123454 11/2007

OTHER PUBLICATIONS

Chang, K. et al., "Active Integrated Antennas", Mar. 2002, pp. 937-944, IEEE Transactions on Microwave Theory and Techniques, vol. 50, No. 3.
Robert, B. et al., "Compact Amplifier Integration In Square Patch Antenna", Sep. 10, 1992, pp. 1808-1810, Electronics Letters, vol. 28, No. 19.
Maclean, T. S. M. et al., "Short Range Active Transmitting Antenna with Very Large Height Reduction", Mar. 1975, pp. 286-287, IEEE Transactions on Antennas and Propagation.
"Active Patch Antenna Element With Diode Tuning", Sep. 26, 1991, pp. 1846-1848, Electronics Letters, vol. 27, No. 20.
TEA5767HN, Integrated Circuits, Data Sheet, Philips Semiconductors, "Low-Power FM Stereo Radio for Handheld Applications", Nov. 12, 2003, pp. 1-38, Preliminary Specification, Supersedes data of Sep. 13, 2002.

* cited by examiner

*Primary Examiner* — Stephen E Jones
(74) *Attorney, Agent, or Firm* — Harrington & Smith (57) ABSTRACT

An apparatus including: a first transistor including a first port configured for connection to an antenna having a first impedance at a first frequency band, and a second port configured for connection to radio circuitry, the first port of the first transistor being configured to have an impedance at the first frequency band substantially equal to the complex conjugate of the first impedance.

30 Claims, 7 Drawing Sheets

APPARATUS AND METHOD FOR WIRELESS COMMUNICATIONS

FIELD OF THE INVENTION

Embodiments of the present invention relate to apparatus and method for wireless communications. In particular, they relate to an apparatus and method for wireless communications in a mobile cellular telephone.

BACKGROUND TO THE INVENTION

Portable communication devices, such as mobile cellular telephones, usually include one or more antennas for receiving and/or transmitting electromagnetic signals. The physical size of an antenna determines, at least in part, the electrical length of the antenna and hence the resonant frequency band of the antenna. Some operational frequency bands such as Frequency Modulation (FM) radio have relatively low frequencies (76-108 MHz) and an antenna may require a relatively large electrical length (0.7 meters for example) in order to operate efficiently. However, portable communication devices are usually relatively small and may not have sufficient internal space to accommodate an antenna having a relatively large physical length.

Therefore, it would be desirable to provide an alternative apparatus.

BRIEF DESCRIPTION OF VARIOUS EMBODIMENTS OF THE INVENTION

According to various, but not necessarily all, embodiments of the invention there is provided an apparatus comprising: a first transistor including a first port configured for connection to an antenna having a first impedance at a first frequency band, and a second port configured for connection to radio circuitry, the first port of the first transistor being configured to have an impedance at the first frequency band substantially equal to the complex conjugate of the first impedance.

The apparatus may be for wireless communication.

The radio circuitry may have a second impedance at the first frequency band. The second port of the first transistor may be configured to have an impedance at the first frequency band substantially equal to the complex conjugate of the second impedance. The first impedance may be lower in impedance than the second impedance. The resistive portion of the first impedance may be lower than the resistive portion of the second impedance.

The impedance of the first and second ports of the first transistor may be configured through the design of the physical attributes of the transistor to achieve a complex matching to the antenna.

The apparatus may further comprise biasing circuitry configured to couple in series with the first transistor.

The first transistor may be a bipolar junction transistor and the first port may be an emitter and the second port may be a collector.

The first transistor may be a field effect transistor and the first port may be a source and the second port may be a drain.

The first transistor may be a portion of the radio circuitry.

The apparatus may further comprise the antenna. The antenna may be directly connected to the first port of the first transistor. The antenna may be directly connected in series to the first port of the first transistor.

The apparatus may further comprise a second transistor including a first port configured for connection to the antenna, and a second port configured for connection to the radio circuitry. The first port of the second transistor may be configured to have an impedance at the first frequency band substantially equal to the complex conjugate of the first impedance.

The first transistor, the second transistor and the antenna may form a differential amplifier.

The second transistor may be a portion of the radio circuitry.

The apparatus may further comprise the antenna. The antenna may be directly connected to the first port of the first transistor and to the first port of the second transistor. The antenna may be directly connected in series to the first port of the first transistor and to the first port of the second transistor.

The radio circuitry may include receiver circuitry and/or transmitter circuitry.

According to various, but not necessarily all, embodiments of the invention there is provided an integrated circuit comprising an apparatus as described in any of the preceding paragraphs.

According to various, but not necessarily all, embodiments of the invention there is provided a portable communication device comprising an apparatus as described in any of the preceding paragraphs.

According to various, but not necessarily all, embodiments of the invention there is provided a portable communication device comprising an integrated circuit as described in any of the preceding paragraphs.

According to various, but not necessarily all, embodiments of the invention there is provided a method comprising: providing a first transistor including a first port configured for connection to an antenna having a first impedance at a first frequency band, and a second port configured for connection to radio circuitry; and configuring the first port of the first transistor to have an impedance at the first frequency band substantially equal to the complex conjugate of the first impedance.

The radio circuitry may have a second impedance at the first frequency band. The method may further comprise configuring the second port of the first transistor to have an impedance at the first frequency band substantially equal to the complex conjugate of the second impedance. The first impedance may be lower in impedance than the second impedance. The resistive portion of the first impedance may be lower than the resistive portion of the second impedance.

The method may further comprise providing biasing circuitry configured to couple in series to the first transistor.

The first transistor may be a portion of the radio circuitry.

The first transistor may be a bipolar junction transistor and the first port may be an emitter and the second port may be a collector.

The first transistor may be a field effect transistor and the first port may be a source and the second port may be a drain.

The method may further comprise providing the antenna and directly connecting the antenna to the first port of the first transistor. The antenna may be directly connected in series to the first port of the first transistor.

The method may further comprise providing a second transistor including a first port configured for connection to the antenna, and a second port configured for connection to the radio circuitry. The method may further comprise configuring the first port of the second transistor to have an impedance at the first frequency band substantially equal to the complex conjugate of the first impedance.

The first transistor, the second transistor and the antenna may form a differential amplifier.

The second transistor may be a portion of the radio circuitry.

The method may further comprise providing the antenna and directly connecting the antenna to the first port of the first transistor and to the first port of the second transistor. The antenna may be directly connected in series to the first port of the first transistor and to the first port of the second transistor.

The radio circuitry may include receiver circuitry and/or transmitter circuitry.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

FIGS. 2 to 5 illustrate an apparatus 14 comprising: a first transistor 26, 38, 50, 72 including a first port 28, 40, 52, 74 configured for connection to an antenna 12 having a first impedance at a first frequency band, and a second port 30, 42, 54, 76 configured for connection to radio circuitry 16, the first port 28, 40, 52, 74 of the first transistor 26, 38, 50, 72 being configured to have an impedance at the first frequency band substantially equal to the complex conjugate of the first impedance.

In the following description, the wording 'connect' and 'couple' and their derivatives mean operationally connected/coupled. It should be appreciated that any number or combination of intervening components can exist (including no intervening components). Additionally, it should be appreciated that the connection/coupling may be a physical galvanic connection and/or an electromagnetic connection.

Figure 1:
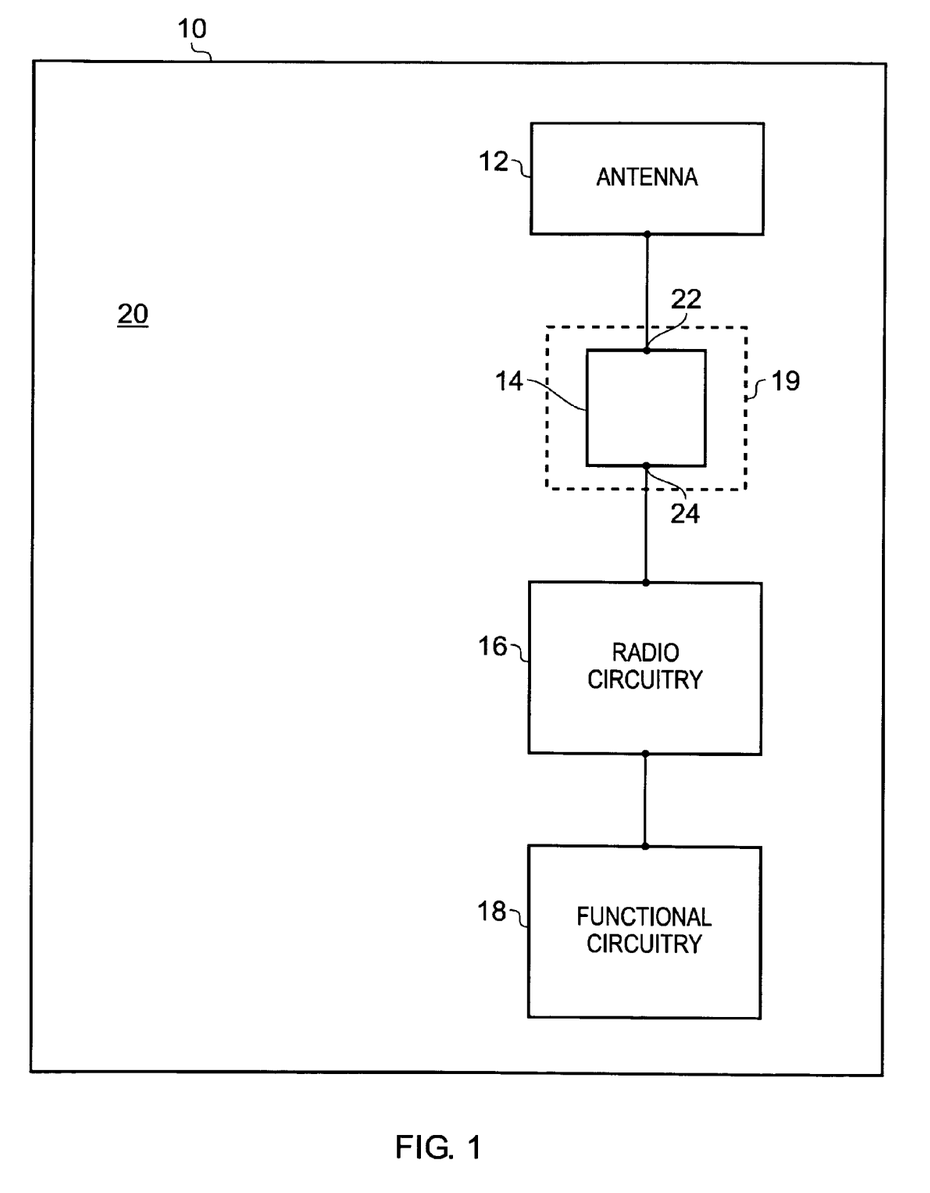
FIG. 1 illustrates a schematic diagram of a portable communication device including an apparatus according to various embodiments of the present invention.

FIG. 1 illustrates a device 10 such as a portable communication device (for example, a mobile cellular telephone or a personal digital assistant) or module for such devices. As used here, 'module' refers to a unit or apparatus that excludes certain parts/components that would be added by an end manufacturer or a user.

The device 10 comprises an antenna 12, an apparatus 14, radio circuitry 16 and functional circuitry 18. The apparatus 14 is connected to the antenna 12 and is also connected to the radio circuitry 16. The apparatus may be implemented on an integrated circuit (IC) 19 and is configured to match the impedance of the antenna 12 to the impedance of the radio circuitry 16 and will be explained in greater detail in the following paragraphs. The radio circuitry 16 may include a receiver and/or a transmitter. The functional circuitry 18 is connected to the radio circuitry 16 and is operable to provide signals to, and/or receive signals from the radio circuitry 16.

In the embodiment where the device 10 is a mobile cellular telephone, the functional circuitry 18 may include a processor, a memory and input/output devices such as a microphone, a loudspeaker and a display. The electronic components that provide the apparatus 14, the transceiver 16 and the functional circuitry 18 may be interconnected via a printed wiring board (PWB) 20. In various embodiments the printed wiring board 20 may be used as a ground plane for the antenna 12, or some other conductive part of the device may be used as a ground plane for the antenna 12. In other embodiments, the antenna 12 may not have a ground plane.

The radio circuitry 16 is configured to encode and/or decode signals in at least a first frequency band. The antenna 12 has an electrical length that is not optimized for the first frequency band and which may result in the antenna 12 having an impedance (hereinafter referred to as the first impedance) at the first frequency band that is substantially different to the impedance of the radio circuitry at the first frequency band (hereinafter referred to as the second impedance). This may result in the antenna 12 operating inefficiently in the first frequency band or being inoperable in the first frequency band.

For example, the first frequency band may be a Frequency Modulation (FM) radio band (76-108 MHz), the electrical length of the antenna 12 may be 0.10 meters and the impedance of FM circuitry 16 may be 50 Ohms. At FM radio frequencies, the optimal electrical length of an antenna is approximately 0.7 meters. Since the antenna 12 has an electrical length that is not optimized for FM frequencies, the real or resistive part of the impedance of the antenna 12 at the FM radio frequencies is approximately 0.2 Ohms. The antenna impedance, as is known in the art, is a complex impedance having a real part (the resistance) and an imaginary part (the reactance which may be either capacitive or inductive).

The apparatus 14 includes a first interface 22 that is connected to the antenna 12 and is configured to have an impedance at the first frequency band that is substantially equal to the complex conjugate of the first impedance of the antenna 12 (within a tolerance that allows the antenna 12 to operate efficiently at the first frequency band). The apparatus 14 also has a second interface 24 that is connected to the radio circuitry 16 and which may be configured to have an impedance at the first frequency band that is substantially equal to the complex conjugate of the second impedance of the radio circuitry 16 (within a tolerance that allows the antenna 12 to operate efficiently at the first frequency band).

In some embodiments of the present invention, the apparatus 14 may be a portion of the radio circuitry 16. In other embodiments, the apparatus 14 may be a separate, discrete component to the radio circuitry 16.

The radio circuitry 16, the apparatus 14 and the antenna 12 may be configured to operate in a plurality of different operational radio frequency bands and via a plurality of different protocols. For example, the different frequency bands and protocols may include (but are not limited to) Long Term Evolution (LTE) 700 (US) (698.0-716.0 MHz, 728.0-746.0 MHz), LTE 1500 (Japan) (1427.9-1452.9 MHz, 1475.9-1500.9 MHz), LTE 2600 (Europe) (2500-2570 MHz, 2620-2690 MHz), amplitude modulation (AM) radio (0.535-1.705 MHz); frequency modulation (FM) radio (76-108 MHz); Bluetooth (2400-2483.5 MHz); wireless local area network (WLAN) (2400-2483.5 MHz); helical local area network (HLAN) (5150-5850 MHz); global positioning system (GPS) (1570.42-1580.42 MHz); US—Global system for mobile communications (US-GSM) 850 (824-894 MHz); European global system for mobile communications (EGSM) 900 (880-960 MHz); European wideband code division multiple access (EU-WCDMA) 900 (880-960 MHz); personal communications network (PCN/DCS) 1800 (1710-1880 MHz); US wideband code division multiple access (US-WCDMA) 1900 (1850-1990 MHz); wideband code division multiple access (WCDMA) 2100 (Tx: 1920-1980 MHz Rx: 2110-2180 MHz); personal communications service (PCS) 1900 (1850-1990 MHz); ultra wideband (UWB) Lower (3100-4900 MHz); UWB Upper (6000-10600 MHz); digital video broadcasting—handheld (DVB-H) (470-702 MHz); DVB-H US (1670-1675 MHz); digital radio mondiale (DRM) (0.15-30 MHz); worldwide interoperability for microwave access (WiMax) (2300-2400 MHz, 2305-2360 MHz, 2496-2690 MHz, 3300-3400 MHz, 3400-3800 MHz, 5250-5875 MHz); digital audio broadcasting (DAB) (174.928-239.2 MHz, 1452.96-1490.62 MHz); radio frequency identification low frequency (RFID LF) (0.125-0.134 MHz); radio frequency identification high frequency (RFID HF) (13.56-13.56 MHz); radio frequency identification ultra high frequency (RFID UHF) (433 MHz, 865-956 MHz, 2450 MHz). An operational frequency band is a frequency range over which an antenna can efficiently operate. Efficient operation occurs, for example, when the antenna's insertion loss S11 is greater than an operational threshold such as 4 dB or 6 dB Embodiments of the present invention provide an advantage in that they enable the connection of an antenna having a non-optimized electrical length for a particular frequency band to be connected to radio circuitry and operate efficiently in that frequency band. For example, embodiments of the present invention enable an antenna having a relatively short electrical length for FM frequencies to be connected to FM radio circuitry and operate efficiently at FM frequencies. This may enable such an antenna to be housed within a portable communication device such as a mobile cellular telephone (which is relatively small in size) and operate efficiently.

Figure 2:
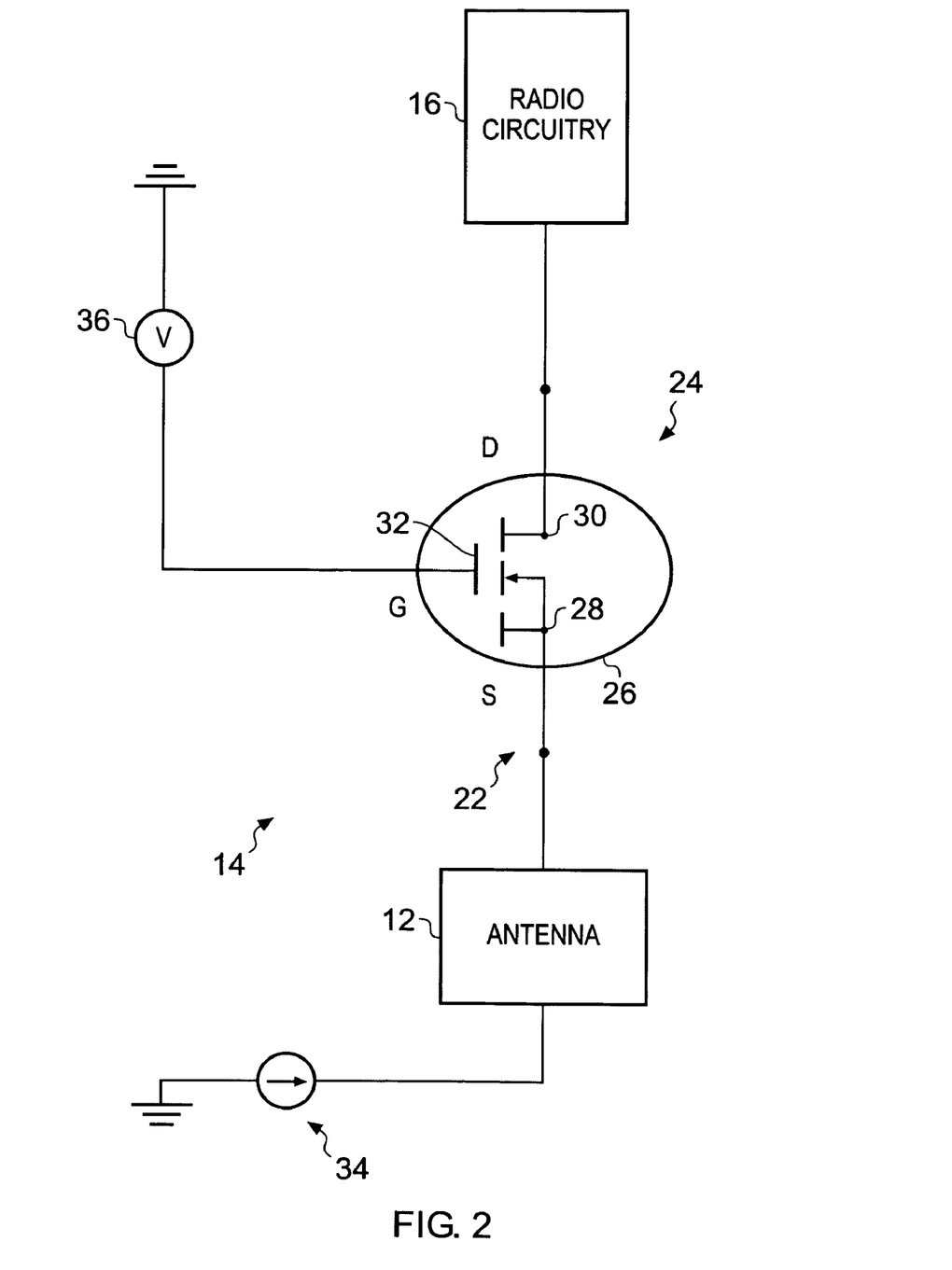
FIG. 2 illustrates a diagram of an apparatus according to various embodiments of the present invention.

FIG. 2 illustrates a diagram of an apparatus 14 according to various embodiments of the present invention. The apparatus 14 includes a transistor 26 comprising a first port 28, a second port 30 and a third port 32; biasing circuitry 34 and a voltage source 36 for gate biasing.

The antenna 12 is connected in series between the first port 28 of the transistor 26 and the biasing circuitry 34 (or directly to ground). The antenna 12 may be any unbalanced antenna and may be for example, a planar inverted F antenna (PIFA), a planar inverted L antenna (PILA) or a monopole. In this embodiment, the antenna 12 is directly connected to the first port 28 of the transistor 26 and there are no intervening components connected in series between the first port 28 and the antenna 12.

The biasing circuitry 34 is connected in series with the antenna 12 and includes a current source connected to ground. The biasing circuitry 34 may include components such as resistors and inductors. Biasing circuitry is well known in the field of transistor circuitry and will not be discussed in any greater detail. The biasing circuitry 34 may improve the noise performance of the transistor 26 when in a low supply voltage environment. It should be appreciated that in various embodiments of the present invention, the apparatus 14 may not include the biasing circuitry 34.

The radio circuitry 16 is connected to the second port 30 of the transistor 26. In some embodiments, the second port 30 may be connected to a differential amplifier in the radio circuitry 16 in order to reduce signal noise.

The voltage source 36 is connected to the third port 32 and to ground. Voltage sources are well known in the art of electronics and are devices that produce an electromotive force and little to no current (an ideal voltage source has a high output impedance). The voltage source 36 is configured to provide a voltage to the third port 32 of the transistor 26 and thereby enable the flow of current between the first port 28 and the second port 30 of the transistor 26.

The transistor 26 is a field effect transistor (FET) and the first port 28 is a source, the second port 30 is a drain and the third port 32 is a gate. From the above description, it should be appreciated that the transistor 26 has a common gate arrangement.

As mentioned above, the antenna 12 has a first impedance at the first frequency band and the radio circuitry has a second impedance (different to the first impedance) at the first frequency band. The transistor 26 is configured so that the first port 28 (the source) has an impedance at the first frequency band which is substantially equal to the complex conjugate of the first impedance (in other words the imaginary parts of the impedance are cancelled out). For example, if the first impedance of the antenna 12 has a real part of two Ohms, the real part of the impedance of the first port 28 is configured to be as close to two ohms as possible.

Complex conjugate matching is well known in the art of electronics and will not be discussed in detail here. In embodiments of the present invention, the first impedance of the antenna 12 includes a real part (resistive) and an imaginary part (reactance). In order to match the impedance of the first port 28 of the transistor 26 to the antenna 12, the first port 28 is configured to have an impedance which has an imaginary part (reactance) which is substantially equal to, but opposite in sign to, the imaginary part of the first impedance. For example, if the first impedance has a capacitive reactance, the first port 28 is configured to have an inductive reactance and vice versa.

The impedance of the first port 28 of the transistor 26 may be determined from the equations:

$$Z_{FirstPort} = \frac{Z_D}{(g_m + g_{mb})r_o} + \frac{1}{g_m + g_{mb}} \qquad \text{Equation 1}$$

$$r_o = \frac{1}{I_D \lambda} \qquad \text{Equation 2}$$

$$\lambda \approx \frac{\Delta L}{L} \qquad \text{Equation 3}$$

Where:
$Z_{First\ Port}$ is the impedance of the first port 28
$Z_D$ is the load (impedance of the radio circuitry 16)
$r_o$ is the transistor 26 output resistance
$g_m$ is main transconductance
$g_{mb}$ is bulk transconductance
$I_D$ is the current through the drain 30 of the transistor 26
$\lambda$ is channel length modulation
L is the length of the gate 32 area of the transistor 26
$\Delta L$ is the apparent change in the length of the gate 32 area of the transistor 26 due to channel length modulation.

The impedance of the first port 28 may be adjusted to a desired value by adjusting $\lambda$ and hence $r_o$. For example, if it is desired to reduce the impedance of the first port 28, one may reduce $\lambda$ (for example, by increasing the length of the gate 32 area of the transistor 26) to obtain a higher $r_o$ and thus obtain a smaller impedance.

The transistor 26 may also be configured so that the second port 30 (the drain) has an impedance at the first frequency band which is substantially equal to the complex conjugate of the second impedance of the radio circuitry 16. For example, if the second impedance of the radio circuitry 16 is fifty Ohms, the impedance of the second port 30 is configured to be as close to fifty ohms as possible.

The impedance for the second port 30 of the transistor 26 may be determined from the following equation:

$$Z_{SecondPort} = ((1+(g_m+g_{mb})r_o))Z_P + r_o \| Z_D \qquad \text{Equation 4}$$

Where:

$Z_{Second\ Port}$ is the impedance of the second port 30

$Z_P$ is the impedance of the antenna 12

$Z_D$ is the load impedance (the impedance of the radio circuitry 16)

$r_o$ Transistor output impedance

The impedance of the second port 30 may be adjusted to a desired value by adjusting $\lambda$ and hence $r_o$. For example, if it is desired to increase the impedance of the second port 30, one may reduce $\lambda$ (for example, by increasing the length of the gate 32 area of the transistor 26) to obtain a higher $r_o$ and thus obtain a larger impedance.

Consequently, the transistor 26 may be configured to match the impedance of the antenna 12 to the impedance of the radio circuitry 16. This may be achieved by designing the physical attributes of the transistor, for example, dimensions of the semiconductor regions, choice of materials, physical layout and structure, etc.

Figure 3:
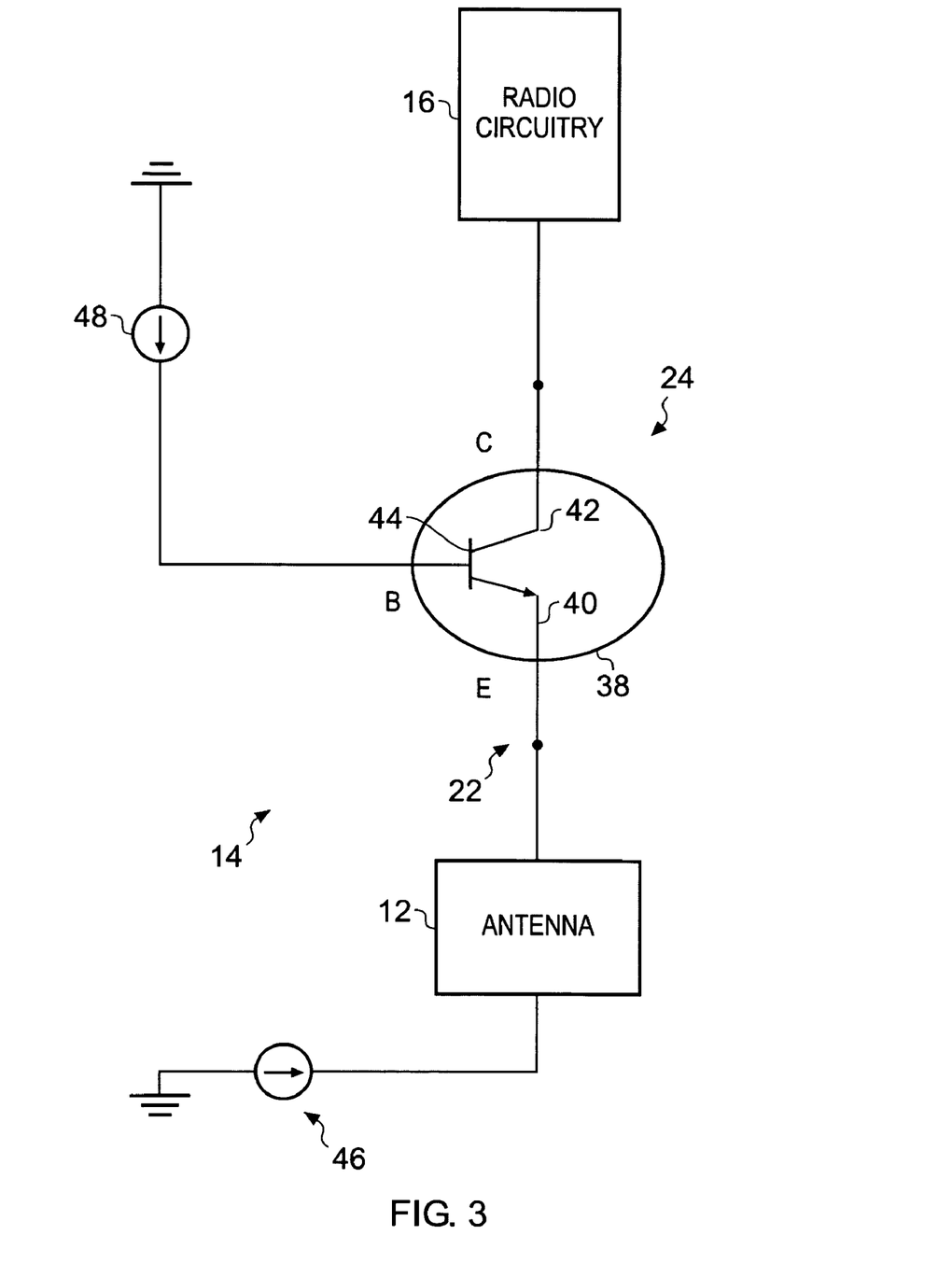
FIG. 3 illustrates a diagram of another apparatus according to various embodiments of the present invention.

FIG. 3 illustrates a diagram of another apparatus 14 according to various embodiments of the present invention. The apparatus 14 includes a transistor 38 comprising a first port 40, a second port 42 and a third port 44; biasing circuitry 46 and a current source 48.

The antenna 12 is connected in series to the first port 40 of the transistor 38. The antenna 12 may be any unbalanced antenna and may be for example, a planar inverted F antenna (PIFA), a planar inverted L antenna (PILA) or a monopole. In this embodiment, the antenna 12 is directly connected to the first port 40 of the transistor 38 and there are no intervening components connected in series between the first port 40 and the antenna 12.

The biasing circuitry 46 is connected in series to the antenna 12 and includes a current source connected to ground. The biasing circuitry 46 may include components such as resistors and inductors. The biasing circuitry 46 may improve the noise performance of the transistor 38 when in a low supply voltage environment. It should be appreciated that in various embodiments of the present invention, the apparatus 14 may not include the biasing circuitry 46.

The radio circuitry 16 is connected to the second port 42 of the transistor 38. In some embodiments, the second port 42 may be connected to a differential amplifier in the radio circuitry 16 in order to reduce signal noise.

The current source 48 is connected to the third port 44 and to ground. Current sources are well known in the art of electronics and are devices that deliver an electric current (an 'ideal' current source is a device that has an impedance of zero ohms). The current source 48 is configured to provide a current to the third port 44 of the transistor 38 and thereby enable the flow of current between the first port 40 and the second port 42 of the transistor 38.

The transistor 38 is a bipolar junction transistor (BJT) and the first port 40 is an emitter, the second port 42 is a collector and the third port 44 is a base.

From the above paragraphs, it should be appreciated that the transistor 38 has a common base arrangement.

As mentioned above, the antenna 12 has a first impedance at the first frequency band and the radio circuitry 16 has a second impedance (different to the first impedance) at the first frequency band. The transistor 38 is configured so that the first port 40 (the emitter) has an impedance at the first frequency band which is substantially equal to the complex conjugate of the first impedance. For example, if the real part of the first impedance of the antenna 12 is two Ohms, the real part of the impedance of the first port 40 is configured to be as close to two ohms as possible.

The impedance of the first port 40 of the transistor 38 may be determined from the following relationships. The common base amplifier input impedance can be made smaller by reducing $r_e$, $r_{bb}$, unity gain frequency $f_T$ or increasing $g_m$. $r_e$ is a physical emitter resistance, $r_{bb}$ is a physical base resistance and $g_m$ is a transconductance. $r_e$ and $r_{bb}$ can be modified by transistor sizing/layout. If the surface areas of the emitter and base contacts are increased, the physical resistance may be reduced. The $f_T$, may be reduced by selecting a larger physical transistor size. Transconductance in general can be increased by larger active emitter area.

The transistor 38 may also be configured so that the second port 42 (the collector) has an impedance at the first frequency band which is substantially equal to the complex conjugate of the second impedance of the radio circuitry 16. For example, if the real part of the second impedance of the radio circuitry 16 is fifty Ohms, the real part of the impedance of the second port 42 is configured to be as close to fifty ohms as possible.

Embodiments of the present invention as illustrated in FIGS. 2 and 3 may provide an advantage in that the transistors 26 & 38 may be used instead of an external/extra low noise amplifier between the antenna 12 and the radio circuitry 16. Since low noise amplifiers are relatively expensive, embodiments of the present invention may reduce the cost of a device 10 such as a mobile cellular telephone. Additionally, transistors which are already present in the radio circuitry 16 may be configured in accordance with embodiments of the present invention. Consequently, no additional transistors may be required in the mobile cellular telephone to implement embodiments of the present invention.

Embodiments of the present invention may also provide any advantage in that since there are no intervening electronic components in series between the antenna 12 and the transistor 26, 38, there is substantially no voltage division between the antenna 12 and the transistor 26, 38. Consequently, embodiments of the invention may have a relatively high signal to noise ratio. Furthermore, the transistor 26, 38 may provide amplification of a signal and thereby function as a pre-amplifier for the radio circuitry 16.

Figure 4:
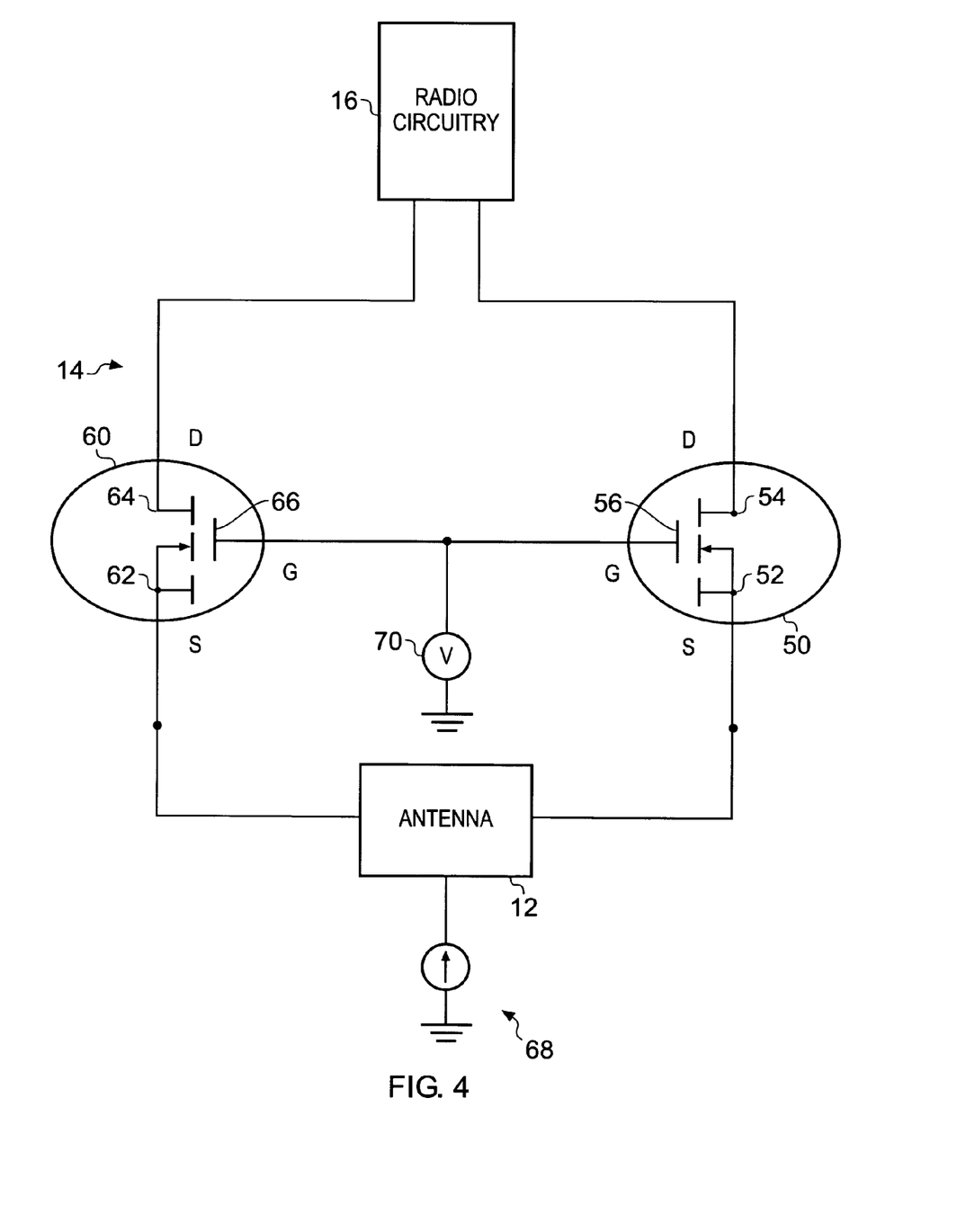
FIG. 4 illustrates a diagram of a further apparatus according to various embodiments of the present invention.

FIG. 4 illustrates a diagram of a further apparatus 14 according to various embodiments of the present invention. The apparatus 14 includes a first transistor 50 comprising a first port 52, a second port 54 and a third port 56; a second transistor 60 comprising a first port 62, a second port 64 and a third port 66; biasing circuitry 68 and a voltage source 70.

The antenna 12 is connected in series to the first port 52 of the first transistor 50 and to the first port 62 of the second transistor 60. In this embodiment, the antenna 12 is a balanced antenna (for example, a loop antenna or a folded dipole antenna) which is directly connected to the first port 52 and the second port 62 and there are no intervening components connected in series between the first port 52, first port 62 and the antenna 12.

The biasing circuitry 68 is connected to the antenna 12 and includes a current source connected to ground. The biasing circuitry 68 may be connected to the physical mid-point of the antenna (that is, half way along the length of the antenna 12 between the first transistor 50 and the second transistor 60). The biasing circuitry 68 is configured to enable the first and second transistors 60 to operate efficiently at the voltage and current levels at which the antenna 12 and radio circuitry 16 operate. The biasing circuitry 68 may include components such as resistors and inductors. It should be appreciated that in various embodiments of the present invention, the apparatus 14 may not include the biasing circuitry 68.

The radio circuitry 16 is connected to the second port 54 of the first transistor 50 and is also connected to the second port 64 of the second transistor 60.

The voltage source 70 is connected to the third port 56 of the first transistor 50, to the third port 66 of the second transistor 60 and to ground. The voltage source 70 is configured to provide voltage to the third port 56 of the first transistor 50 and to the third port 66 of the second transistor 60 and thereby enable the flow of current between the first port 52 and the second port 54 of the first transistor 50 and between the first port 62 and the second port 64 of the second transistor 60.

The first and second transistors 50, 60 are field effect transistors (FET) and the first ports 52, 62 are sources, the second ports 54, 64 are drains and the third ports 56, 66 are gates. From the above paragraphs, it should be appreciated that the first and second transistors 50, 60 have a common gate arrangement and are configured as a differential pair.

Embodiments of the invention provide a differential transistor pair in the common gate configuration by providing a differential input signal with a common ground at the midpoint of the antenna 12. The transistor pair 50, 60 is differential since the antenna 12 provides a one hundred and eighty degree phase difference between the signals received at the first ports 52, 62 of the transistors 50, 60. It should be appreciated that in the antenna 12 the current only travels in one direction at a time, so if the current travels in the direction from first port 62 to first port 52, the port 52 has a zero degree phase shift and the port 62 has a one hundred and eighty degree phase shift.

As mentioned above, the antenna 12 has a first impedance at the first frequency band and the radio circuitry has a second impedance (different to the first impedance) at the first frequency band. The first and second transistors 50, 60 are configured so that the first ports 52, 62 (the sources) have an impedance at the first frequency band which is substantially equal to the complex conjugate of the first impedance. For example, if the real part of the first impedance of the antenna 12 is two Ohms, the real part of the impedance of the first ports 52, 62 are configured to be as close to two ohms as possible.

The first and second transistors 50, 60 may also be configured so that the second ports 54, 64 (the drains) have an impedance at the first frequency band which is substantially equal to the complex conjugate of the second impedance of the radio circuitry 16. For example, if the real part of the second impedance of the radio circuitry 16 is fifty Ohms, the real part of the impedance of the second ports 54, 64 is configured to be as close to fifty ohms as possible.

Figure 5:
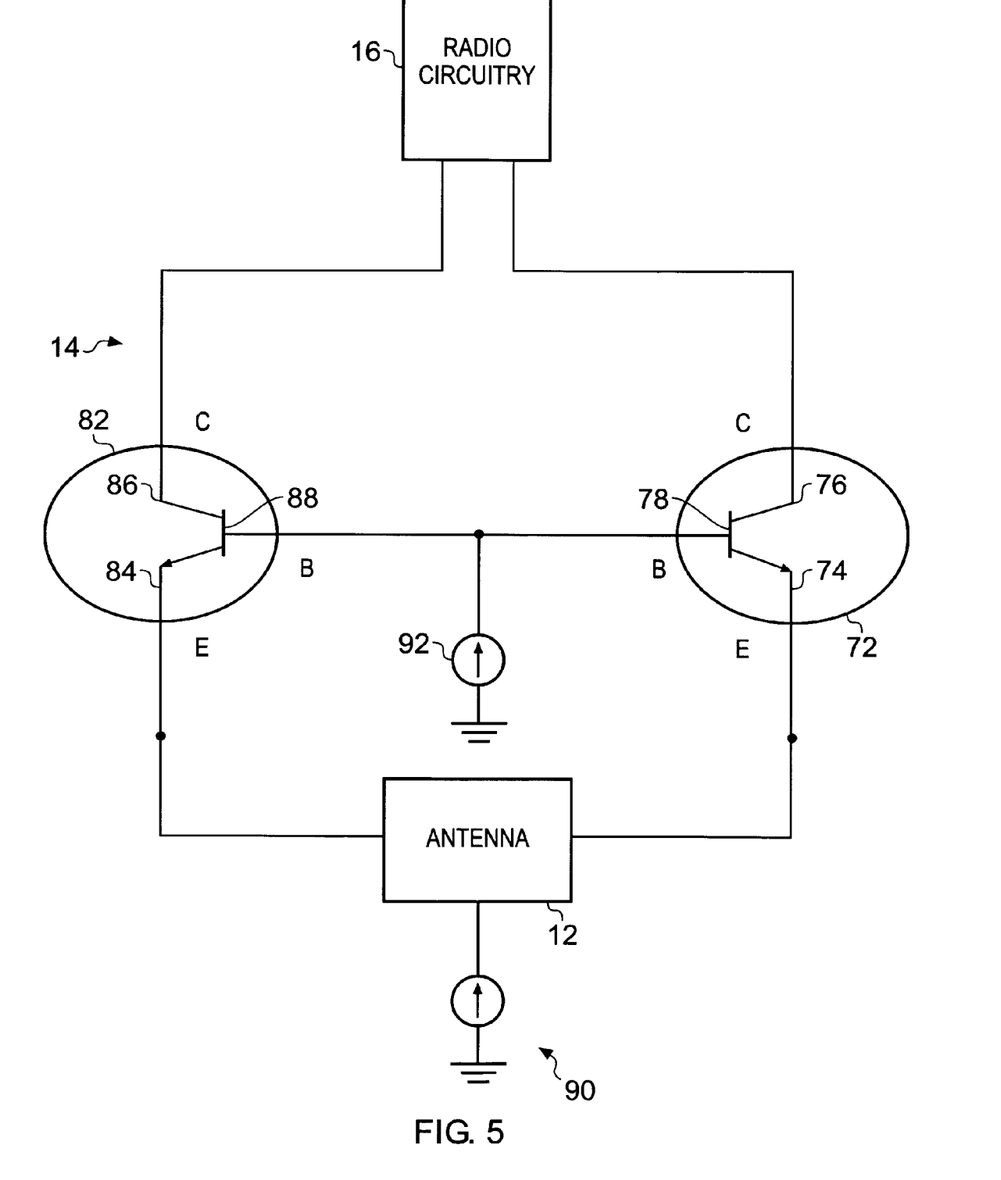
FIG. 5 illustrates a diagram of another apparatus according to various embodiments of the present invention.

FIG. 5 illustrates a diagram of another apparatus 14 according to various embodiments of the present invention. The apparatus 14 includes a first transistor 72 comprising a first port 74, a second port 76 and a third port 78; a second transistor 82 comprising a first port 84, a second port 86 and a third port 88; biasing circuitry 90 and a current source 92.

The antenna 12 is connected in series to the first port 74 of the first transistor 72 and to the first port 84 of the second transistor 82. In this embodiment, the antenna 12 is a balanced antenna (for example, a loop antenna or a folded dipole antenna) which is directly connected to the first port 74 and the second port 84 and there are no intervening components connected in series between the first port 74, first port 84 and the antenna 12.

The biasing circuitry 90 is connected to the antenna 12 and includes a current source connected to ground. The biasing circuitry 90 may be connected to the physical mid-point of the antenna (that is, half way along the length of the antenna 12 between the first transistor 72 and the second transistor 82). The biasing circuitry 90 is configured to enable the first and second transistors 72, 82 to operate efficiently at the voltage and current levels at which the antenna 12 and radio circuitry 16 operate. The biasing circuitry 90 may include components such as resistors and inductors. It should be appreciated that in various embodiments of the present invention, the apparatus 14 may not include the biasing circuitry 90.

The radio circuitry 16 is connected to the second port 76 of the first transistor 72 and is also connected to the second port 86 of the second transistor 82.

The current source 92 is connected to the third port 78 of the first transistor 72, to the third port 88 of the second transistor 82 and to ground. The current source 92 is configured to provide current to the third port 78 of the first transistor 72 and to the third port 88 of the second transistor 82 and thereby enable the flow of current between the first port 74 and the second port 76 of the first transistor 72 and between the first port 84 and the second port 86 of the second transistor 82.

The first and second transistors 72, 82 are bipolar junction transistors (BJT) and the first ports 74, 84 are emitters, the second ports 76, 86 are collectors and the third ports 78, 88 are gates. From the above paragraphs, it should be appreciated that the first and second transistors 72, 82 have a common base arrangement and are configured as a differential pair.

Embodiments of the invention provide a differential transistor pair in the common base configuration by providing a differential input signal with a common ground at the midpoint of the antenna 12. The transistor pair 72, 82 is differential since the antenna 12 provides a one hundred and eighty degree phase difference between the signals received at the first ports 74, 84 of the transistors 72, 82. It should be appreciated that in the antenna 12 the current only travels in one direction at a time, so if the current travels in the direction from first port 84 to first port 74, the port 74 has a zero degree phase shift and the port 84 has a one hundred and eighty degree phase shift.

As mentioned above, the antenna 12 has a first impedance at the first frequency band and the radio circuitry 16 has a second impedance (different to the first impedance) at the first frequency band. The first and second transistors 72, 82 are configured so that the first ports 74, 84 (the emitters) have an impedance at the first frequency band which is substantially equal to the complex conjugate of the first impedance. For example, if the real part of the first impedance of the antenna 12 is two Ohms, the real part of the impedance of the first ports 74, 84 are configured to be as close to two ohms as possible.

The first and second transistors 72, 82 may also be configured so that the second ports 76, 86 (the collectors) have an impedance at the first frequency band which is substantially equal to the complex conjugate of the second impedance of the radio circuitry 16. For example, if the real part of the second impedance of the radio circuitry 16 is fifty Ohms, the real part of the impedance of the second ports 76, 86 is configured to be as close to fifty ohms as possible.

Embodiments of the present invention as illustrated in FIGS. 4 and 5 may provide an advantage since the transistors 50, 60, 72 and 82 are configured as a differential pair of transistors. This configuration may provide a relatively high signal to noise ratio since the pairs of transistors 50, 60 and 72, 82 may only amplify the difference between their respective signals.

Figure 6:
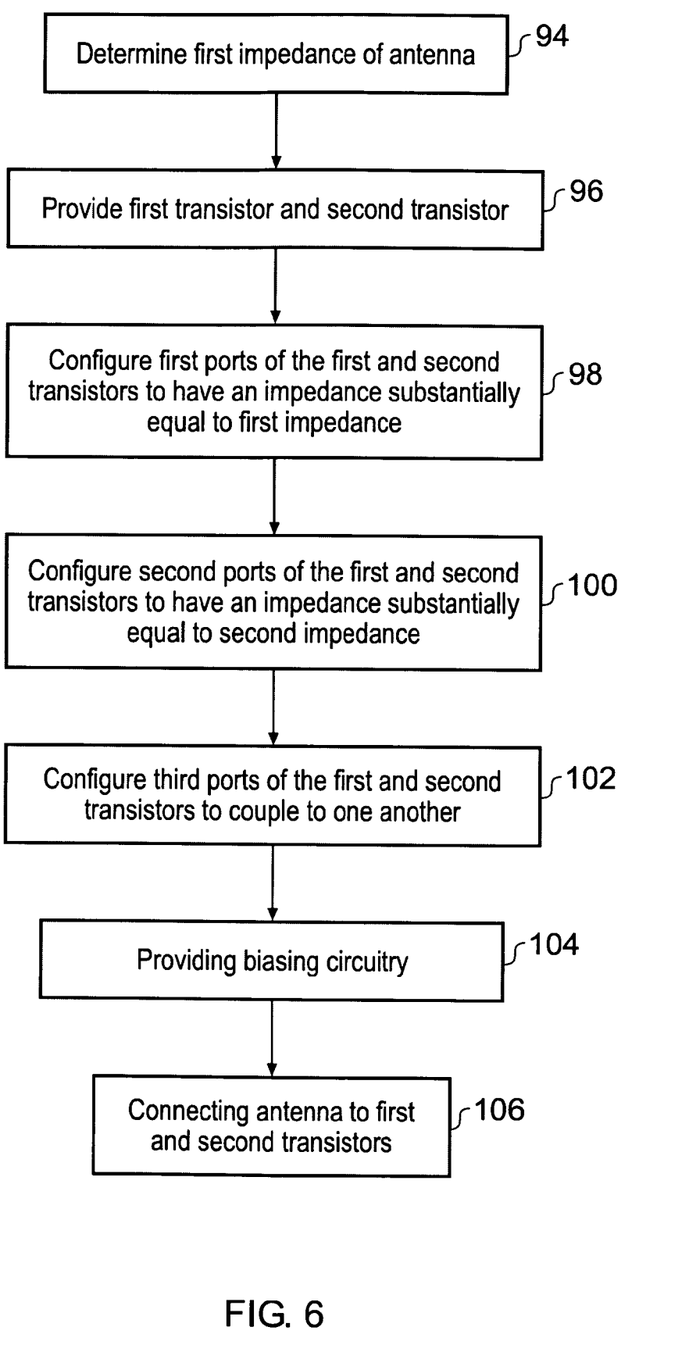
FIG. 6 illustrates a flow diagram of a method for manufacturing an apparatus according to various embodiments of the present invention.

FIG. 6 illustrates a flow diagram of a method of manufacturing an apparatus 14 according to various embodiments of the present invention. At block 94, the impedance of the antenna 12 is determined (that is, the first impedance is determined). The impedance of the radio circuitry 16 may also be determined in block 94 (that is, the second impedance may also be determined).

At block 96, the first and second transistors 50 & 60 or 72 & 82 are provided.

At block 98, the first ports 52, 62, 74, 84 of the first and second transistors 50, 60, 72, 82 are configured (as described above with reference to FIGS. 2 and 3) to have an impedance which is substantially equal to the complex conjugate of the first impedance determined in block 94. At block 100, the second ports 54, 64, 76, 86 of the first and second transistors 50, 60, 72, 82 are configured (as described above with reference to FIGS. 2 and 3) to have an impedance which is substantially equal to the complex conjugate of the second impedance determined in block 94.

At block 102, the third ports 56, 66 or 78, 88 are configured to be coupled to one another and may also be configured to couple to the voltage/current source 70, 92. At block 104, biasing circuitry 68, 90 may be provided and connected to the antenna 12 in series. At block 106, the antenna 12 may be connected to the first and second transistors 50, 60, 72 and 82.

The illustration of a particular order to the blocks does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed. For example, the method illustrated in FIG. 6 is discussed with reference to the apparatus 14 shown in FIGS. 4 and 5. However, it should be appreciated that the method illustrated in FIG. 6 is applicable to other forms of apparatus 14 and may be applicable to the apparatus 14 illustrated in FIGS. 2 and 3 with certain changes (for example, block 96 may not include providing a second transistor).

Where a transistor is a bipolar junction transistor (BJT), the transistor may be an npn transistor or a pnp transistor. Where a transistor is a field effect transistor (FET), the transistor may be an nmos transistor or a pmos transistor.

In the embodiments described above with reference to FIGS. 2 to 5, the radio circuitry 16 is a receiver. However, it should be appreciated that embodiments of the present invention may be used with a transmitter and such an embodiment is illustrated in FIG. 7.

Figure 7:
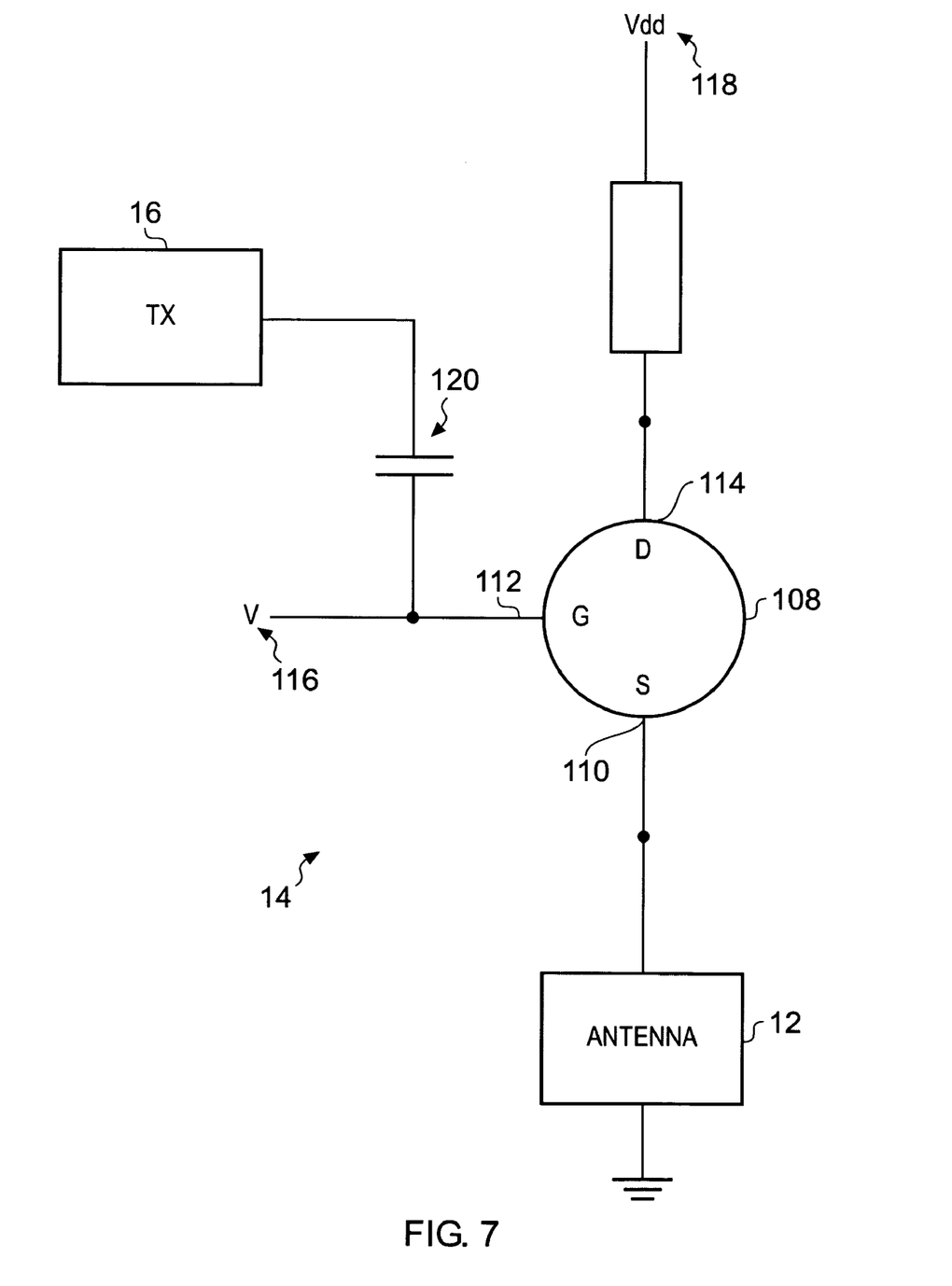
FIG. 7 illustrates a diagram of a further apparatus according to various embodiments of the present invention.

FIG. 7 illustrates a diagram of an apparatus 14 according to various embodiments of the present invention. The apparatus 14 includes a transistor 108 comprising a first port 110, a second port 112 and a third port 114; a voltage source 116 for gate biasing, and a voltage source 118.

The antenna 12 is connected in series between the first port 110 of the transistor 108 and ground. The antenna 12 may be any unbalanced antenna and may be for example, a planar inverted F antenna (PIFA), a planar inverted L antenna (PILA) or a monopole. In this embodiment, the antenna 12 is directly connected to the first port 110 of the transistor 108 and there are no intervening components connected in series between the first port 110 and the antenna 12.

The transmitter 16 is connected to the second port 112 of the transistor 26 via a series capacitor 120. The voltage source 116 is also connected to the second port 112 and is arranged in parallel with the transmitter 16. In some embodiments, the second port 112 may be connected to a differential amplifier in the transmitter 16 in order to reduce signal noise.

The voltage source 118 is connected to the third port 114 via a series load impedance.

The transistor 108 is a field effect transistor (FET) and the first port 110 is a source, the second port 112 is a gate and the third port 114 is a drain. From the above description, it should be appreciated that the transistor 108 has a source follower arrangement for transmitting the FM signals. Some bias values may need to be changed when switching from the transmitter (Tx) (source follower) to the receiver (Common Gate).

As mentioned above, the antenna 12 has a first impedance at the first frequency band and the transmitter 16 has a second impedance (different to the first impedance) at the first frequency band. The transistor 108 is configured so that the first port 110 (the source) has an impedance at the first frequency band which is substantially equal to the complex conjugate of the first impedance.

The transistor 108 may also be configured so that the second port 112 (the gate) has an impedance at the first frequency band which is substantially equal to the complex conjugate of the second impedance of the transmitter 16.

It should be appreciated that the embodiment illustrated in FIG. 7 may alternatively include a bipolar junction transistor or be arranged to include a differential pair of transistors (either field effect transistors or bipolar junction transistors).

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
   a first transistor including a first port configured for connection to an antenna having a first impedance at a first frequency band, and a second port configured for connection to radio circuitry, the first port of the first transistor being configured to have an impedance at the first frequency band substantially equal to the complex conjugate of the first impedance.

2. An apparatus as claimed in claim 1, further comprising biasing circuitry configured to couple in series with the first transistor.

3. An apparatus as claimed in claim 1, wherein the first transistor is a bipolar junction transistor and the first port is an emitter and the second port is a collector.

4. An apparatus as claimed in claim 1, wherein the first transistor is a field effect transistor and the first port is a source and the second port is a drain.

5. An apparatus as claimed in claim 1, wherein the first transistor is a portion of the radio circuitry.

6. An apparatus as claimed in claim 1, wherein the radio circuitry includes receiver circuitry and/or transmitter circuitry.

7. A portable communication device comprising an apparatus as claimed in claim 1.

8. An apparatus as claimed in claim 1, wherein the radio circuitry has a second impedance at the first frequency band, and the second port of the first transistor is configured to have an impedance at the first frequency band substantially equal to the complex conjugate of the second impedance.

9. An apparatus as claimed in claim 8, wherein the first impedance is lower in impedance than the second impedance.

10. An apparatus as claimed in claim 1, further comprising the antenna, the antenna being directly connected to the first port of the first transistor.

11. An apparatus as claimed in claim 10, wherein the antenna is directly connected in series to the first port of the first transistor.

12. An integrated circuit comprising an apparatus as claimed in claim 1.

13. A portable communication device comprising an integrated circuit as claimed in claim 12.

14. An apparatus as claimed in claim 1, further comprising a second transistor including a first port configured for connection to the antenna, and a second port configured for connection to the radio circuitry, the first port of the second transistor being configured to have an impedance at the first frequency band substantially equal to the complex conjugate of the first impedance.

15. An apparatus as claimed in claim 14, wherein the first transistor, the second transistor and the antenna form a differential amplifier.

16. An apparatus as claimed in claim 14, wherein the second transistor is a portion of the radio circuitry.

17. An apparatus as claimed in claim 14, further comprising the antenna, the antenna being directly connected to the first port of the first transistor and to the first port of the second transistor.

18. An apparatus as claimed in claim 17, wherein the antenna is directly connected in series to the first port of the first transistor and to the first port of the second transistor.

19. A method comprising:
providing a first transistor including a first port configured for connection to an antenna having a first impedance at a first frequency band, and a second port configured for connection to radio circuitry; and
configuring the first port of the first transistor to have an impedance at the first frequency band substantially equal to the complex conjugate of the first impedance.

20. A method as claimed in claim 19, further comprising providing biasing circuitry configured to couple in series to the first transistor.

21. A method as claimed in claim 19, wherein the first transistor is a portion of the radio circuitry.

22. A method as claimed in claim 19, wherein the radio circuitry includes receiver circuitry and/or transmitter circuitry.

23. A method as claimed in claim 19, wherein the radio circuitry has a second impedance at the first frequency band, and the method further comprises configuring the second port of the first transistor to have an impedance at the first frequency band substantially equal to the complex conjugate of the second impedance.

24. A method as claimed in claim 23, wherein the first impedance is lower in impedance than the second impedance.

25. A method as claimed in claim 19, further comprising providing the antenna and directly connecting the antenna to the first port of the first transistor.

26. A method as claimed in claim 25, wherein the antenna is directly connected in series to the first port of the first transistor.

27. A method apparatus as claimed in claim 19, further comprising providing a second transistor including a first port configured for connection to the antenna, and a second port configured for connection to the radio circuitry; and configuring the first port of the second transistor to have an impedance at the first frequency band substantially equal to the complex conjugate of the first impedance.

28. A method as claimed in claim 27, further comprising providing the antenna and directly connecting the antenna to the first port of the first transistor and to the first port of the second transistor.

29. A method as claimed in claim 27, wherein the first transistor, the second transistor and the antenna form a differential amplifier.

30. A method as claimed in claim 27, wherein the second transistor is a portion of the radio circuitry.

* * * * *